United States Patent [19]

Westfall et al.

[11] Patent Number: 4,624,738

[45] Date of Patent: Nov. 25, 1986

[54] CONTINUOUS GAS PLASMA ETCHING APPARATUS AND METHOD

[75] Inventors: Raymond T. Westfall; Erich J. Feldl, both of Seminole, Fla.

[73] Assignee: E. T. Plasma, Inc., Gulfport, Fla.

[21] Appl. No.: 754,854

[22] Filed: Jul. 12, 1985

[51] Int. Cl.4 .................... B44C 1/22; C03C 15/00; C03C 25/06

[52] U.S. Cl. .................... 156/643; 156/345; 156/646; 156/902; 204/298; 204/192.32

[58] Field of Search ............... 156/643, 646, 668, 345, 156/654, 902; 204/192 E, 298; 427/38, 39; 118/729, 50.1, 620; 134/1

[56] References Cited

U.S. PATENT DOCUMENTS

| | | | |
|---|---|---|---|
| 4,151,034 | 4/1979 | Yamamoto et al. | 156/345 |
| 4,230,553 | 10/1980 | Bartlett et al. | 204/192 E |
| 4,252,595 | 2/1981 | Yamamoto et al. | 156/345 |
| 4,277,321 | 7/1981 | Bartlett et al. | 204/192 E |
| 4,282,077 | 8/1981 | Reavill | 204/192 E |
| 4,289,598 | 9/1981 | Engle | 204/192 E |
| 4,328,081 | 5/1982 | Fazlin | 204/192 E |
| 4,371,422 | 2/1983 | Eidschun | 156/640 |
| 4,399,014 | 8/1983 | Engle | 204/192 E |
| 4,431,473 | 2/1984 | Okano et al. | 156/345 |
| 4,496,420 | 1/1985 | Frohlich | 156/643 |

FOREIGN PATENT DOCUMENTS 58-21333  2/1983  Japan .................................. 156/345

Primary Examiner—William A. Powell
Attorney, Agent, or Firm—Pettis & McDonald

[57] ABSTRACT

A method and apparatus are disclosed for continuous plasma etching of generally planar workpieces in which the workpieces are introduced into an evacuated chamber containing the plasma, are carried along a continuous processing path and are removed therefrom. The plasma is generated within the chamber and the workpieces are supported within an electrically neutral field within the processing plasma.

31 Claims, 10 Drawing Figures

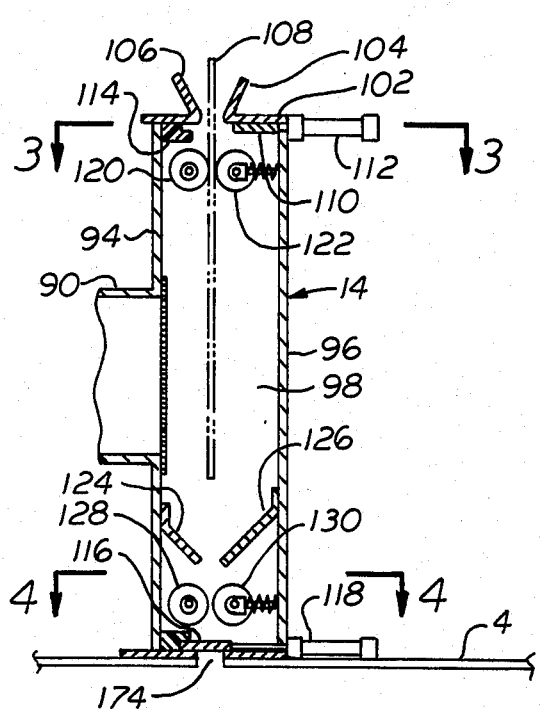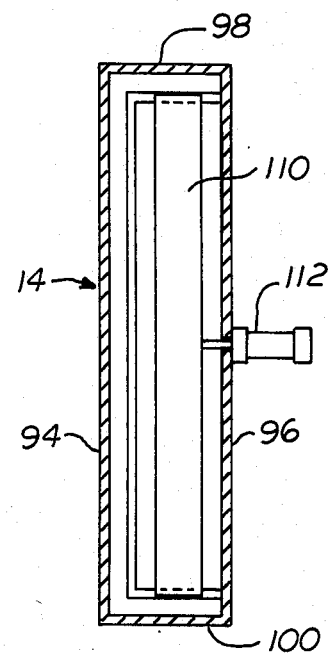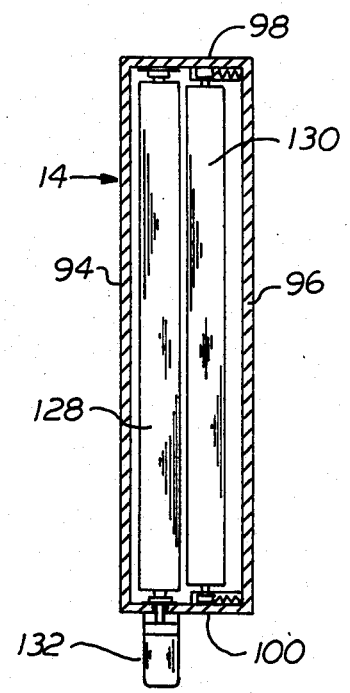
FIG. 2
FIG. 3
FIG. 4

CONTINUOUS GAS PLASMA ETCHING APPARATUS AND METHOD

BACKGROUND OF THE INVENTION

I. Field of the Invention

The present invention relates to apparatus and methods used for continuous process etching of workpieces by a gas discharge plasma.

II. Description of the Prior Art

Gas plasma etching is a process applicable to etching semi-conductor devices and to etching or desmearing holes in printed circuit boards. The process provides a chemical reaction to remove selected portions of patterns formed on semiconductor device or to remove unwanted organic material from holes drilled in printed circuit boards. Such debris is referred to as "smearing" and results from the drilling process in which the insulating base material in a multilayer printed circuit board, or other foreign material, is forced by the action of drills used in forming holes in those boards to extend over the conductive inner circuits. Such smearing can prevent proper electrical connection.

To correct the problem of smearing it has become common practice for manufacturers of such multilayer printed circuit boards to apply an etching agent to the drilled board to etch the smearing material from the holes and thus provide clean connections among the circuit layers. In the past this etching procedure has been done through the use of a wet process, using liquid acids and similar materials. However, the wet processes have created serious problems of disposal of the highly toxic by-products.

To overcome certain of the disadvantages of the wet process etching various techniques have been developed for etching workpieces such as printed circuit boards or semiconductor wafers, or the like, utilizing an etchant material in the form of a gas plasma activated by the application of radio frequency energy to certain combinations of gases. These plasma etching techniques have materially reduced the quantity of toxic waste by-products to be disposed and have materially reduced the environmental danger resulting from the etching. However, most of the processes used in gas plasma etching are batch processes in which a batch of workpieces are inserted into a chamber that is subsequently evacuated and then have introduced thereinto the gas plasma for etching. Such batch processing has significant disadvantages because of the necessity to purge the chamber and completely open it for removal of processed workpiece and insertion of additional workpieces to be processed. One prior art piece of apparatus, disclosed in Yamamoto U.S. Pat. No. 4,151,034, teaches a modified batch process in which batches of semi-conductor wafers are placed into a feeding chamber ahead of the processing chamber and fed sequentially from that feeding chamber into the processing chamber, out of the processing chamber into a rebatching receiving chamber that collects wafers until a batch is completed, which batch is then removed. This apparatus of Yamamoto et al is directed toward semiconductor wafer workpieces and suffers several disadvantages due to the large feeding and receiving chambers necessary to collect complete batches of workpieces.

SUMMARY OF THE INVENTION

In view of the numerous disadvantages of the prior art etching apparatus, it is an object of the present apparatus to provide a continuous etching process and apparatus in which the actual gas plasma is generated within the processing chamber. It is a further object of this invention to provide such an apparatus, and method of use, in which a plasma is so generated and substantially surrounds those workpieces while the workpieces are maintained within an electrically neutral field.

To achieve these and other objects that will become apparent to those skilled in the art apparatus and a method for its use are disclosed for continuous plasma etching of generally planar workpieces, with that apparatus including the processing chamber, structure for substantially evacuating that processing chamber, devices for introducing predetermined types and quantities of gases into the processing chamber, structure for introducing workpieces into the processing chamber while maintaining substantial evacuation of that chamber, structure for supporting and moving the workpieces along a predetermined path within the processing chamber, apparatus for generating within the processing chamber an electrically charged plasma such that the plasma substantially surrounds the workpieces while maintaining the workpieces within an electrically neutral field, and devices for removing the workpieces from the processing chamber while maintaining substantial evacuation of that processing chamber.

BRIEF DESCRIPTION OF THE DRAWINGS

The continuous plasma etching apparatus and method of this invention will be disclosed in greater detail below in connection with the drawings in which:

FIG. 2 is a sectional elevational view, taken along line 2—2 of FIG. 1, and illustrated at a substantially larger scale to show certain of the interior components of the apparatus of FIG. 1;

FIG. 3 is a top sectional view of the workpiece introducing chamber taken along line 3—3 of FIG. 2;

FIG. 4 is a top sectional view of the same introducing chamber taken along line 4—4 of FIG. 2;

DESCRIPTION OF A PREFERRED EMBODIMENT

Several embodiments of the apparatus and method of this invention will be described below, and one preferred embodiment, that shown in FIG. 1, will described in substantial detail.

Figure 1:
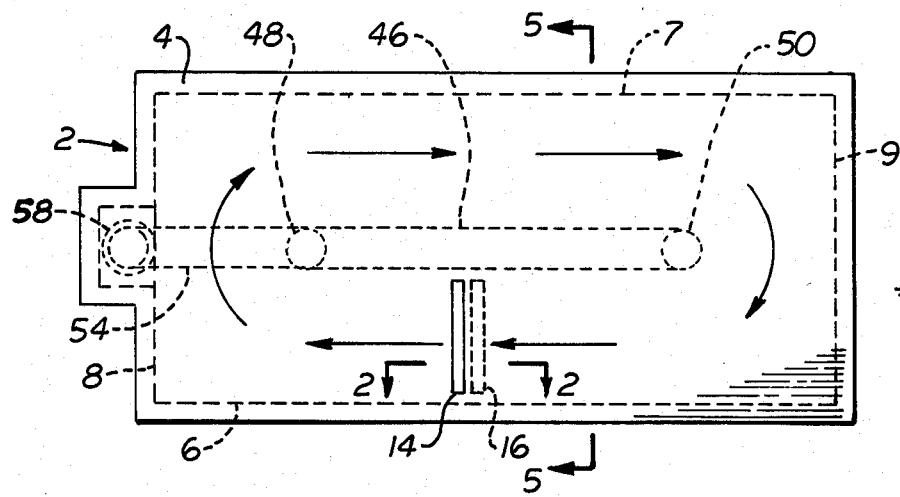
FIG. 1 is a top plan view of the exterior of one embodiment of the apparatus of this invention.

The top plan view of FIG. 1 illustrates primarily the processing chamber 2 with its top plate 4 and side walls 6, 7, 8 and 9 (shown in phantom).

Figure 5:
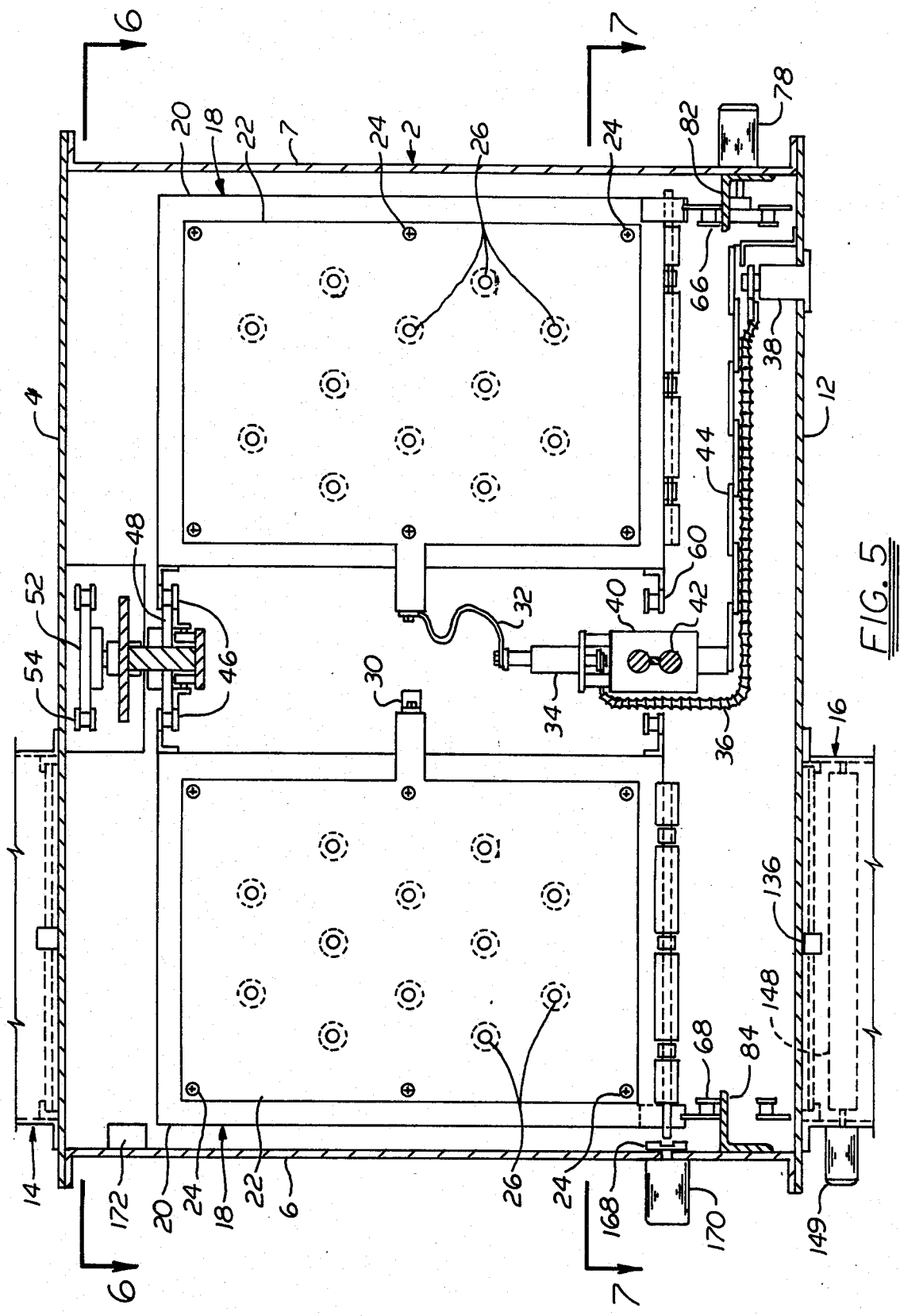
FIG. 5 is an end sectional view of the apparatus of FIG. 1, shown on a larger scale, and taken along line 5—5 of FIG. 1.

The six arrows defining a "racetrack" shape illustrate the preferred direction of movement of workpieces within the processing chamber, in a manner to be described below. The end elevational sectional view of FIG. 5 is taken along line 5—5 of FIG. 1 and illustrates a number of internal components of this apparatus in addition to the components comprising the housing 2.

These components include the top plate 4, the side portions 6, 7, 8 and 9 and the bottom plate 12. Shown connected to the top plate 4 is a fragment of the workpiece introducing apparatus 14, which will be described in greater detail below. Likewise, a fragment of the workpiece removing apparatus 16 is shown connected to the bottom plate 12.

Among these internal components are the holders 18 that cooperate with other components to support the workpieces to be processed and to carry them around the processing path, as will be described below. These holders 18 each include one or more, preferably two in this embodiment, grounded plates 20 that function as ground electrodes and one or more, again preferably two, powered plates 22 that serve as the power electrodes. These power electrodes 22 and ground electrodes 20 cooperate to generate a gas plasma in a manner to be described below.

The screw heads 24 visible along the power electrodes 22 attach those power electrodes to insulated standoffs in a manner that will be illustrated more clearly with respect to FIG. 2. Likewise, a plurality of other insulating members, which conveniently may be ceramic balls 26 or other devices such as ceramic rods or tubes, insulatingly separate the power electrodes 22 from their adjacent ground electrodes 20, as shown in both FIGS. 2 and 5. FIG. 2 also illustrates the insulating standoffs 28 that cooperate with the screws 24 (FIG. 5) to hold the adjacent ground electrode 20 power electrode 22 pairs together.

Figure 7:
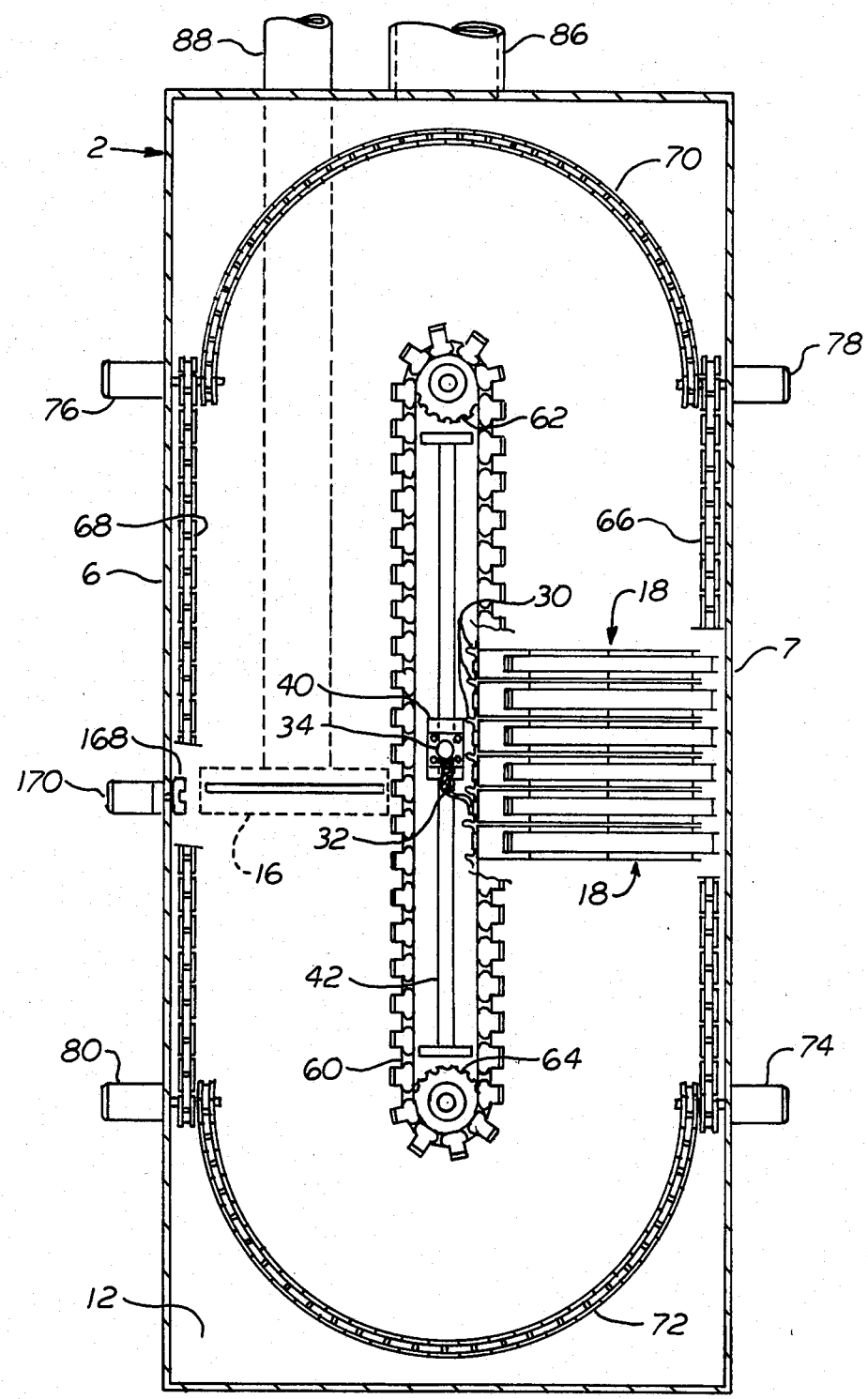
FIG. 7 is a sectional view taken along line 7—7 of FIG. 5.

Adjacent power electrodes 22 are electrically connected together by flexible metallic straps 30, as shown in FIGS. 5 and 7. These straps provide electrical continuity between adjacent power electrodes while permitting a certain degree of relative movement between adjacent holders 18. These power electrodes are then connected by a flexible strap to a pivoting connector 34 as shown in FIG. 5. This rotating connector 34 is of a conventional type known to those skilled in the art for rotary connection of radio frequency energy. This connector in turn is attached to a power cable 36, which preferably may be shielded as shown in FIG. 5, to a vacuum tight feedthrough 38 mounted to the bottom plate 12 of the housing. This feedthrough 38 is also of a conventional type known to those skilled in the art for providing a connection of radio frequency energy across the panel 12 while maintaining vacuum integrity.

The rotary connector 34 may suitably be carried on a car 40 that is supported by a rail 42 for sliding movement between the extremities of rail 42 to follow the movement of the holder 18 to which the power strap 32 is attached, as that holder is carried around the processing path by the drive means as described below. FIG. 5 also illustrates a cable supporting mechanism 44, which suitably may be in the nature of a pantograph or similar structure, with one end pivotally mounted adjacent the pivotal connector 38 and the other end connected to the bottom of the car 40. This cable supporting device 44 provides support for the cable 36 as the car moves back and forth along track 42.

Each of the holders 18 is independently carried for movement around a predefined path within the processing chamber. This carrying apparatus may suitably comprise a plurality of flexible chains. A first chain 46, shown in FIGS. 5 and 6 may be attached to the upper inside corners of each of the carriers 18. This chain is supported at each end by sprockets 48 and 50. Sprocket 48 is drivingly connected to a second sprocket 52 (FIG. 5) which is drivingly engaged by drive chain 54. On the path of drive chain 54 opposite sprocket 52 is drive sprocket 56, also engaging the chain 54, and drivingly connected to conventional means, such as an electric motor 58, shown in phantom, and which is suitably located outside the processing chamber with a shaft extending through an appropriate seal to support the sprocket 56.

The lower inside corner of each of the holders 18 may similarly be joined to and supported by a lower chain 60. This chain 60 may suitably be carried by sprocket 62 and 64 mounted coaxially with sprockets 48 and 50, respectively. Sprocket 52 may suitably be driven in synchronism with sprocket 48 by an appropriate drive motor or other conventional means that may conventionally be positioned below the bottom plate 12 of the processing chamber, or alternatively, by extending a shaft downwardly from drive sprocket 52 and upper sprocket 48.

The outer edges of each of the holders 18 are preferably supported on and drivingly engaged with additional apparatus, such as a plurality of outer drive chains, to maintain the relative positioning of the outer edges of those holders. These outer drive chains, shown in FIGS. 5 and 7, may include side chains 66 and 68 and flexible end chains 70 and 72. Side chains 66 and 68 run substantially parallel to the sides 6 and 7 of the processing chamber. They are driven, suitably by synchronous motors 74 and 76, to run at substantially the same lineal speed as the inner drive chains 46 and 60. Thus, with the outer edges of the holders 18 engaging the side chain 66 and 68, the holders 18 will be maintained in predetermined spatial relationships, preferably parallel to one another, while those holders 18 move parallel to the side 6 and 7 of the processing chamber.

Figure 6:
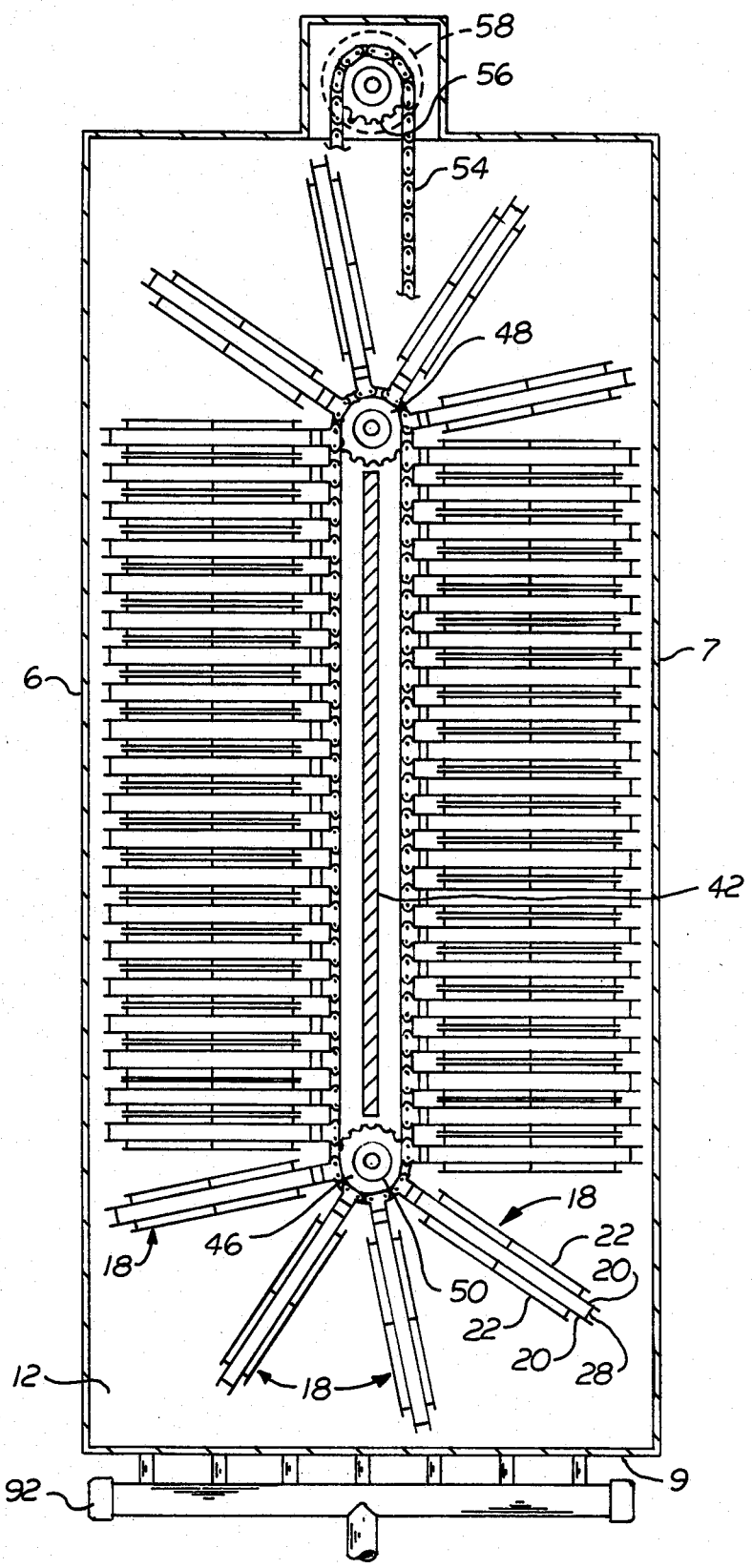
FIG. 6 is a top plan sectional view taken along line 6—6 of FIG. 5.

End chains 70 and 72 are preferably of the type that will flex not only in the direction around the axis of a driving sprocket but also in the direction about an axis normal the axis of such a drive sprocket, thus permitting the driving engagement to occur along a curved path, as shown in FIG. 7. The end chains 70 and 72 may suitably be driven by motors 78 and 80, with suitable sprockets engaging only those end chains 70 and 72. The linear speed of those chains 70 and 72 will be proportional to the speed of movement of inner chain 46 and 60 multiplied by the ratio of the radius of the arc described by that chain in FIG. 7 and the radius of inner sprocket 64. Such a driving speed will maintain the various holders 18 oriented substantially normal to the inner chain 46 at the point of connection of the respective holders 18 therewith, as shown in FIG. 6. While drive motors 78 and 80 are shown in FIG. 7 as having their shafts colinear with sprockets for side chains 66 and 68, it should be noted that sprockets for those side chains 66 and 68 may conveniently rotate freely as idlers on the shaft of the motors 78 and 80 and not be driven thereby.

As shown in FIG. 5, the outer chains 66 and 68 may preferably be supported by suitable chain guides 82 and 84 to reduce the tendency of the side chain 66 and 68 to sag.

The top sectional view of FIG. 7 illustrates a portion of two evacuation lines 86 and 88. Evacuation line 86 leads from an aperture communicating with the interior of the processing chamber through a conventional variable conductance valve to a suitable vacuum pump for evacuating the chamber to a predetermined low pressure. Evacuation line 88 leads from the workpiece removing chamber also to a vacuum pump, for the purpose of selectively evacuating the workpiece removing chamber 16, in a manner to be described below. It is to be understood that a substantially similar evacuation line 90 extends between workpiece introducing chamber 14 and suitable evacuation pump apparatus, for evacuating the workpiece introducing chamber 14 in a manner to be described below.

FIG. 6 also shows apparatus, such as a manifold 92, communicating suitably through an end wall 9 of the processing chamber and with a source (not shown) of processing gases, for introduction of those processing gases into the processing chamber 2. Those gases may suitably, but without limitation, include tetrafluromethane ($CF_4$) at a concentration of 10 percent to 20 percent combined with nitrogen at a concentration of about 10 percent and oxygen at a concentration of about 70 percent to 80 percent.

In FIG. 2 is illustrated a section taken along line 2—2 of FIG. 1. This sectional view illustrates a group of four adjacent workpiece holders 18 positioned generally adjacent the workpiece introducing chamber 14 and the workpiece removing chamber 16. These workpiece introducing and removing chambers may, if desired, be generally similar to one another in configuration and manner of operation. For this reason, only the workpiece introducing chamber is illustrated in detail in the sectional views of FIGS. 3 and 4.

The workpiece introducing chamber 14 may suitably include side portions 94 and 96 and end portions 98 and 100. The top of this chamber 14 includes top panel 102 having flared workpiece guiding means 104 and 106 on opposite sides of a slot through which a workpiece 108 may be introduced. Communication between the interior of the workpiece introducing chamber and the ambient pressure exterior, such as the room in which this apparatus is located, may be selectively opened or sealed by the operation of a valve, such as the reciprocating slide valve 110 shown in FIG. 2. This slide valve 110 reciprocates between the open position shown in FIG. 2, opening communication between the ambient pressure exterior and the interior of the chamber, and a closed position, as shown in the top sectional view of FIG. 3 in which the valve slide is urged by a conventional actuator 112 into sealing engagement with the guide 114 to provide a substantially vacuum tight seal between the workpiece introducing chamber 14 and the ambient pressure exterior. A similar slide valve 116 and actuator 118 are provided at the bottom of the workpiece introducing chamber 14 to selectively control the opening and closing of communication between the interior of that workpiece introducing chamber 14 and the interior of the processing chamber 2.

Although the workpiece 108 could be dropped straight into the workpiece introducing chamber 14 and then into the processing chamber 2 under the force of gravity, it is preferred to provide some means for sequentially introducing workpieces in a controlled manner. One suitable combination includes the arrangement of a driven feed roller 120 and a resiliently biased mating pinch roller 122 that feeds a workpiece 108 into the chamber 14 at a controlled rate. Adjacent the lower portion of the introducing chamber 14 may be provided additional guides 124 and 126 to assist in guiding the workpiece 108 into driving contact with the lower driven roller 128 and mating pinch roller 130. The driving roller 128, similar to upper driving roller 120, may be driven by appropriate means, such as an electric motor 132, whose operation is controlled in a conventional manner well known to those skilled in the art.

The workpiece removing chamber 16, shown in FIG. 2, may conveniently be substantially similar in construction to the workpiece introducing chamber 14 described above. It may include a slide valve 134 operated by actuator 136 and engagable with seat 138 to sealingly control communication between the processing chamber 2 and the workpiece removing chamber 16. Similarly, other valve means 140, controlled by actuator 142 and engaging seat 144 may sealingly control communication along outlet slot 146 between the workpiece removing chamber 16 and the ambient pressure exterior. Likewise, the upper and lower driven rollers 148 and 150, respectively, may cooperate with resiliently biased pinch rollers 152 and 154 to control the rate of removal of the workpiece from the processing chamber into the removing chamber 16 and from the removing chamber 16 to the ambient pressure exterior. Also, additional guiding means 156 and 158 may be provided to guide the movement of a workpiece 160 during its removal from the processing chamber ultimately to the ambient pressure exterior.

As shown in FIG. 2, a workpiece 162 that has been feed into the processing chamber is supported within a holder 18 between two facing ground electrodes 20. As can be seen in the view of FIG. 2, the insulating members 26, shown here in the form of ceramic or other material, serve not only to maintain separation between the respective ground electrodes 20 and its adjacent power electrode 22 but also to provide support to the workpiece 162 to hold it away from contact with the ground electrode 20. While the positioning of the workpiece 162 between the ground electrodes 20 places that workpiece in a electrically neutral field, the support by these insulating members 26 may provide the additional benefit of permitting freer circulation of the etching plasma around the workpiece.

The workpiece 162 is supported on the bottom by releaseable support 164, which is attached to actuator member 166 and pivotally movable shaft 168. The actuator number 166 may be operated to pivot the support 164 from the generally horizontal workpiece supporting position shown in the leftmost holder 18 of FIG. 2 to a workpiece releasing, generally vertical, orientation shown with respect to the holder that is releasing the workpiece 160 into the workpiece removing chamber. This support 164 and its actuator member 166 remain normally in the closed, workpiece supporting position, with the support member 164 generally horizontal. However, when the respective workpiece holder 18 has been moved around the processing path, shown by the arrows in FIG. 1, to position that particular holder 18 above the workpiece removing chamber 16, the actuator member 166 may be engaged by actuating arm 168, shown on FIGS. 5 and 7. This actuating arm 168 may be connected to the shaft of a rotary actuator 170, or other similar actuators, for selective engagement with the actuator member 166 and rotation of that actuator member, preferably through a ninety degree movement shown in FIG. 2. Such actuation is synchronized with the operation of the workpiece removing apparatus associated with the chamber 16, in a manner to be described below.

The embodiment of this invention that has been described in detail above corresponds to that shown schematically in the top plan view of FIG. 1. In this embodiment the workpiece introducing chamber 14 is positioned atop the processing chamber 2, and the workpiece removing chamber 16 is positioned therebelow. The workpiece introducing chamber 14 is also offset from alignment with removing chamber 16 a distance equal to the space between the workpiece receiving portions of adjacent holders 18, with the introducing chamber 14 moved ahead that distance in the direction of the processing path to be followed by the workpieces and their holders.

Figure 8:
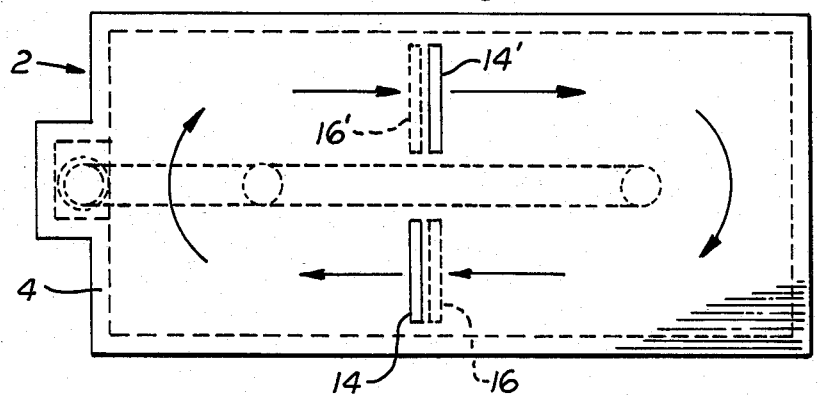
FIGS. 8 through 10 are top plan views of other embodiments of the apparatus of FIG. 1.
Figure 9:
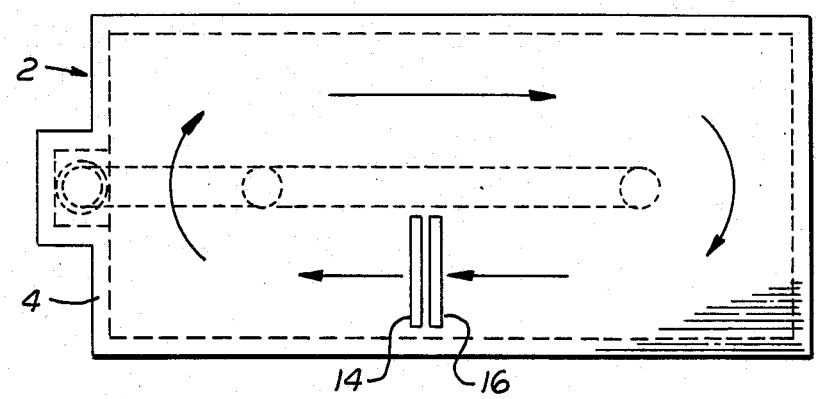
Figure 10:
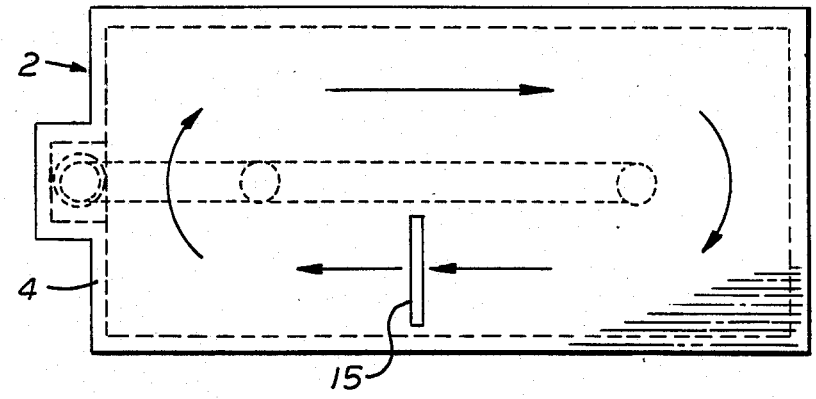

FIGS. 8 through 10 illustrate alternative embodiments utilizing different arrangements of the workpiece introducing and removing chambers 14 and 16, respectively. For example, FIG. 8 incorporates dual pairs of the workpiece introducing chambers 14 and 14' and corresponding pairs of the workpiece removing chambers 16 and 16'. The primary difference between the structure of FIG. 1 and FIG. 8 is that the workpieces may be removed after making only half of a complete circuit around the continuous path followed by the workpiece supporting and moving apparatus.

In FIG. 9 the workpiece introducing chamber 14 is shown in the same position as in FIG. 1, but with the workpiece removing chamber positioned adjacent thereto, also on the top panel 4 of the processing chamber 2. In this embodiment of FIG. 9 the workpieces are both introduced and removed from the processing chamber 2 from above. The embodiment of FIG. 10 is again generally similar to that of FIG. 1, but utilizes only a single chamber 15 for both introduction and removal of workpieces. While this embodiment provides certain simplifications of the structure, both it and the embodiment of FIG. 9 provide an additional difficulty of having to remove the workpieces against the force of gravity instead of in conjunction therewith. Additionally, the embodiment of FIG. 10 complicates magazine feeding of workpieces into the processing chamber and reception of completed workpieces into removal magazines, because both operation have to occur to the same chamber.

With preferred embodiments of the apparatus of this invention having been described in detail above, the operation may now be described. When the apparatus is first started, the vacuum pumps are turned on for all three of the vacuum lines 86, 88 and 90, thus evacuating processing chamber 2, the workpiece introducing chamber 14 and the workpiece removing chamber 16. These chambers are evacuated to the base pressure of the pumps by opening the variable conductance valves to the vacuum pumps while maintaining closed all exhaust valves and the valves 110 and 140 closing the introducing chamber 14 and removing chamber 16 from the ambient pressure exterior.

When the pumping brings the entire system to the base pressure of the pumps, the predetermined mixture of processing gases is introduced into the processing chamber 2, suitably through manifold 92. The rate of introduction of the gases and the operation of the vacuum pumps is then controlled with appropriate valves on the vacuum lines and gas supply lines to establish an equilibrium pressure within the chambers. This pressure may suitably be in the range of 100 microns to 500 microns, or about 0.1 torr to 0.5 torr. At this point appropriate automatic controls well known to those skilled in the art are activated to maintain the equilibrium pressure and desired rate of flow of the processing gases, and the workpiece carrier drive motors 58, 74, 76 and 80 are activated to begin the movement of the carriers through the chamber. Each of these motors preferably operates in a stepwise continuous manner, moving the holders 18 around the processing path as shown in FIGS. 1 and 6 with intermittent stops to position the holders 18 sequentially in alignment with the workpiece introducing chamber 14 and workpiece removing chamber 16 and workpiece introducing chamber 14, as shown in FIG. 2.

When the equilibrium pressure has been reached within the chamber, the radio frequency energy is turned on to provide such energy through the various cabling to the power electrodes 22. This energy is adjusted to a desired predetermined level, which may suitably be on the order of ten to thirty kilowatts at a 600 volt potential. The introduction of this radio frequency energy thus provides for electrical excitation of the processing gases to form the desired etching plasma. The system is then operated in this condition, but substantially empty of workpieces, until an equilibrium temperature has been reached within the processing chamber. This may be expected to take between ten and thirty minutes. At this point the apparatus is ready to begin processing workpieces.

At all times during the operation of this apparatus the pressure, rate of flow of processing gases, level of radio frequency energy and speed of drive of the workpiece supporting and moving means is monitored and controlled by conventional automatic control apparatus. Because this apparatus is well known to those skilled in the art and forms no part of the present invention, it is not described in further detail here.

Position sensor 172 (FIG. 5), which may be a magnetic pickup, microswitch or other position sensing device, determines when the various workpiece holders 18 are positioned on their drive chains to align an empty holder with aperture 174 in the bottom of the workpiece introducing chamber 14, with the adjacent holder 18 and its completely processed workpiece being aligned over the receiving port 176 in workpiece removing chamber 16, as shown in FIG. 2. Valve 110 at the top of introducing chamber 14 is then opened to receive a new workpiece 108 from the ambient pressure exterior. When the workpiece 108 has been received entirely within chamber 14, valve 110 is closed and that chamber 14 is evacuated through vacuum line 90, the lower valve 116 in that chamber also being closed. At the same time both valves 134 and 140 of workpiece removing chamber 16 are also closed and that chamber is evacuated through vacuum line 88.

When these two chambers 14 and 16 reach the base pressure of their pumping apparatus, the lower valve 116 of the introducing chamber 14 and upper valve 134 of removing chamber 16 are opened. The stepwise movement of the workpiece supporting and moving apparatus is then stopped with the holders 18 positioned as shown in FIG. 2. The lower drive roller 128 of introducing chamber 114 and upper drive roller 148 of workpiece removing chamber 16 are then activated. At this same time the actuator 170 with its actuating arm 168 engaging the actuator member 166 of the holder 18 positioned above the removing chamber 16 is actuated as shown in FIG. 2, rotating the support member 164 out of supporting engagement of the workpiece 160 which has just completed its plasma etching processing within the processing chamber 2. This permits the fully processed workpiece 160 to drop into engagement with the drive rollers 148 and associated pinch roller 152 to move that processed workpiece 160 completely into removing chamber 16. At the same time, new workpiece 108 is being fed by drive roller 128 into the immediately preceding empty holder 18 to begin the processing of that fresh workpiece. The drive rollers 128 and 148 continue their driving operation until their respective workpieces 108 and 160 have cleared engagement with those rollers. At this time the fresh, unprocessed workpiece 108 is now supported within one of the holders 18 and the fully processed workpiece 160 is completely within the workpiece removing chamber 16. At this time the valves 116 and 134 are closed. With the closing of these valves, actuator 170 is then energized to reset the actuator member 166 to position the workpiece supporting member 164 into the supporting, horizontal position. With this resetting of the supporting member 164 the freshly emptied holder 18 is now ready to be advanced one step into alignment with the workpiece introducing chamber to receive a new workpiece to be processed.

With the workpiece introducing chamber 14 now empty and the workpiece removing chamber 16 now carrying a completely processed workpiece and sealed off from processing chamber 2, both of those chambers 14 and 16 are then let up to ambient pressure of the exterior. At this same time the workpiece supporting and driving mechanism for moving the holders 18 around the processing path is energized and moved one step forward to align the newly emptied holder 18 below the valve 116 of the introducing chamber 14. When atmospheric pressure is reached, the upper valve 110 of the introducing chamber 14 and lower valve 140 of the removing chamber 16 are then opened. The top drive roller 120 of the introducing chamber 14 and lower drive roller 150 of the removing chamber 116 are then actuated to feed a fresh, unprocessed workpiece 108 into the introducing chamber 14 and to feed the fully processed workpiece 160 out of the removing chamber 16 until it falls freely away from engagement between drive roller 150 and associated pinch roller 154. As before, when the unprocessed workpiece 108 has been received completely within the introducing chamber 14 and the fully processed workpiece 160 has completely cleared the outlet port 146 of the removing chamber 16, valves 110 and 140 are then closed and the chambers 14 and 16 are again evacuated. At this point the entire sequence is repeated.

While this mechanical activity is taking place, continuously introducing fresh workpieces into the processing chamber 2 and removing fully processed workpieces therefrom, those workpieces within the chamber are carried around the processing path. Within this processing chamber the electrically activated plasma surrounds the workpieces and provides the etching action for either etching a predetermined pattern or removing drill smear from the workpieces, as desired. Because of the arrangement of the electrodes, the workpieces are supported within an electrically neutral field, thus providing each workpiece with a more uniform application thereto of the etching plasma. This provides for advantageous treatment of the workpieces, and the continuous introduction, processing and removal provides substantial additional benefits. These additional benefits includes not only the potential for substantially increased throughput over batch processing systems but also avoidance of the exposure of workers to large quantities of noxious gases when such a batch processing chamber is periodically opened to remove processed workpieces. By the present apparatus and method the processing gases may be continuously flowed through the system and then collected for disposal or dispersion, an activity materially simplified by the continuous small quantities being used instead of the periodic large quantities experienced by batch processing systems.

While the foregoing description is directed to particularly preferred embodiments of the present invention, it is to be understood that these embodiments are representative only of the principles of the invention and are not to be considered limitative thereof. Because numerous variations and modifications of both the apparatus and the method, all within the scope of the present invention, will become apparent to those skilled in the art, the scope of the invention is to be limited solely by the claims appended hereto.

We claim:

1. Apparatus for continuous plasma etching of generally planar workpieces, said apparatus comprising:
   a substantially airtight enclosed processing chamber;
   means for substantially evacuating said processing chamber;
   means for introducing predetermined types and quantities of gases into said processing chamber;
   means for introducing workpieces into said processing chamber while maintaining substantial evacuation of said processing chamber;
   means for supporting and moving said workpieces along a predetermined path within said processing chamber;
   means for generating within said processing chamber an electrically charged plasma such that said plasma substantially surrounds said workpieces while maintaining said workpieces within an electrically neutral field; and
   means for removing workpieces from said processing chamber while maintaining substantial evacuation of said processing chamber.

2. The apparatus of claim 1 wherein said plasma generating means comprises means positioned adjacent said workpieces for generating said plasma adjacent said workpieces.

3. The apparatus of claim 2 wherein said plasma generating means comprises means positioned adjacent each said workpiece.

4. The apparatus of claim 3 wherein said plasma generating means comprises a ground electrode positioned adjacent each broad side of each said workpiece and a power electrode positioned adjacent but spaced from each said ground electrode with said ground electrode interposed between said power electrode and the respective said workpiece.

5. The apparatus of claim 4 wherein said electrodes are supported by said workpiece supporting and moving means, whereby the electrodes are carried along the same path with the workpieces.

6. The apparatus of claim 1 wherein said workpiece path comprises at least a portion of a continuous path followed by said supporting and moving means.

7. The apparatus of claim 1 wherein said workpiece introducing means comprises mean for sequentially introducing individual workpieces into said processing chamber from the ambient pressure exterior.

8. The apparatus of claim 7 wherein said workpiece introducing means comprises a chamber selectively communicating with said processing chamber and selectively communicating with said exterior to receive workpieces from outside the apparatus, whereby the introducing chamber may be selectively opened or closed to the processing chamber or to the exterior or to both.

9. The apparatus of claim 8 further comprising evacuating means connected to said introducing chamber for evacuating said introducing chamber after a workpiece has been introduced thereinto and before communication is opened between said introducing chamber and said processing chamber.

10. The apparatus of claim 8 wherein said introducing chamber further includes means for guiding a workpiece along a predetermined introducing path into said processing chamber.

11. The apparatus of claim 10 further comprising means for positioning said workpiece supporting and moving means in general alignment with said workpiece introducing path to receive an introduced said workpiece within said processing chamber.

12. The apparatus of claim 1 wherein said workpiece removing means comprises means for sequentially removing workpieces from said processing chamber to the ambient pressure exterior.

13. The apparatus of claim 12 wherein said workpiece removing means comprises means for releasing a workpiece from said workpiece supporting and moving means.

14. The apparatus of claim 12 wherein said workpiece removing means comprises a chamber selectively communicating with said processing chamber and selectively communicating with said exterior to receive workpieces from said processing chamber for delivery to said exterior, whereby the workpiece removing chamber may be selectively opened or closed to the processing chamber or to the exterior or to both.

15. The apparatus of claim 14 further comprising evacuating means connected to said workpiece removing chamber for evacuating said workpiece removing chamber before a workpiece is introduced thereinto from said processing chamber.

16. The apparatus of claim 14 wherein said workpiece removing chamber includes means for guiding the removal of a workpiece along a predetermined path from said processing chamber.

17. The apparatus of claim 16 further comprising means for positioning said workpiece supporting and moving means in general alignment with said workpiece removal path whereby the workpiece removing chamber may receive a removed said workpiece from said processing chamber.

18. The apparatus of claim 1 wherein said workpiece supporting and moving means comprises carrier means for supporting said introduced workpieces and drive means for urging said carrier means along said processing chamber path.

19. The apparatus of claim 18 wherein said drive means comprises means for stepwise movement of said carrier means along said processing chamber path.

20. The apparatus of claim 18 wherein said carrier means comprises a plurality of holders each holding a single workpiece and wherein said drive means further comprises means for maintaining said holders in predetermined relationships spaced from one another as said holders are moved along said processing chamber path.

21. The apparatus of claim 18 wherein said plasma generating means comprises electrodes attached to said carrier means.

22. The apparatus of claim 21 wherein said carrier means comprises a plurality of holders each holding a single workpiece and wherein said electrodes comprise at least one power electrode and at least one ground electrode attached to each said holder.

23. The apparatus of claim 22 wherein a ground electrode is positioned proximal each broad side of each said supported workpiece and a power electrode is positioned adjacent but spaced from each said ground electrode with said ground electrode interposed between said power electrode and the respective said workpiece.

24. The apparatus of claim 22 wherein said plasma generating means further comprises means for conducting radio-frequency energy to said power electrodes while said electrodes are moved along said processing chamber path.

25. A method of continuous plasma etching of workpieces within a processing chamber, comprising the steps of:
evacuating said processing chamber and maintaining said processing chamber at a predetermined low pressure;
introducing predetermined types and quantities of processing gases into said processing chamber;
introducing workpieces into said processing chamber while maintaining said processing chamber substantially at said predetermined low pressure;
supporting and moving said workpieces along a predetermined path within said processing chamber;
generating an electrically charged plasma within said processing chamber and surrounding said workpieces while maintaining said workpieces within an electrically neutral field; and
removing said workpieces from said processing chamber to an ambient pressure exterior location while maintaining the interior or said processing chamber substantially at said predetermined low pressure.

26. The method of claim 25 wherein said plasma is generated by applying radio-frequency energy to said gases at locations intermediate adjacent workpieces.

27. The method of claim 26 wherein said radio-frequency energy is so applied to said gases while said workpieces are being moved along said predetermined path.

28. The method of claim 26 wherein said workpieces are of generally planar configuration and are introduced sequentially into said processing chamber and are supported therewithin with the broad surfaces of said workpieces generally vertical.

29. The method of claim 28 wherein said plasma is generated by applying radio-frequency energy to electrodes positioned intermediate adjacent said workpieces and moving said electrodes along said processing chamber path with said workpieces.

30. The method of claim 29 wherein said workpieces are supported within said processing chamber intermediate pairs of ground electrode with said ground electrodes being interposed between said workpieces and power electrodes to which said radio-frequency energy is applied.

31. The method of claim 25 wherein said workpieces are introduced sequentially and individually from the ambient pressure exterior into said processing chamber, are moved in a stepwise continuous manner along said processing chamber path and are removed sequentially and individually from said processing chamber to the ambient pressure exterior.

* * * * *